(12) United States Patent
Aoki et al.

(10) Patent No.: US 12,733,133 B2
(45) Date of Patent: Sep. 8, 2026

(54) HEAT SINK

(71) Applicant: FURUKAWA ELECTRIC CO., LTD., Tokyo (JP)

(72) Inventors: Hirofumi Aoki, Tokyo (JP); Kenya Kawabata, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 144 days.

(21) Appl. No.: 18/900,139

(22) Filed: Sep. 27, 2024

(65) Prior Publication Data

US 2025/0024645 A1 Jan. 16, 2025

Related U.S. Application Data

(63) Continuation of application No. PCT/JP2023/006683, filed on Feb. 24, 2023.

(30) Foreign Application Priority Data

Mar. 29, 2022 (JP) ................................. 2022-054633

(51) Int. Cl.
*H05K 7/20* (2006.01)

(52) U.S. Cl.
CPC ....... *H05K 7/2039* (2013.01); *H05K 7/20336* (2013.01)

(58) Field of Classification Search
CPC .. H05K 7/2039; H05K 7/20336; F28D 15/02; F28D 15/0275; H10W 40/73
(Continued)

(56) References Cited

U.S. PATENT DOCUMENTS 5,697,428 A 12/1997 Akachi et al.
7,343,962 B2 * 3/2008 Xia .................... H10W 40/226 257/E23.099
(Continued)

FOREIGN PATENT DOCUMENTS

CN 111836515 A 10/2020
CN 212876430 U 4/2021
(Continued)

OTHER PUBLICATIONS

International Search Report and Written Opinion dated Apr. 11, 2023 from corresponding International Patent Application No. PCT/JP2023/006683, 13 pages.
(Continued)

*Primary Examiner* — Jon T. Schermerhorn, Jr.
(74) *Attorney, Agent, or Firm* — Ruggiero McAllister & McMahon LLC

(57) ABSTRACT

Provided is a heat sink that can prevent dryout without impairing heat transfer characteristics even when an environmental temperature at the time of use is lower than a melting point of a working fluid. The heat sink includes a heat transport member including a heat receiving part thermally connected to a heat generating body, and a first heat radiating fin group in which a plurality of first heat radiating fins are arranged, the first heat radiating fin group being thermally connected to the heat transport member at a heat radiating part, the heat transport member has an inner space that communicates from the heat receiving part to the heat radiating part and in which a working fluid is sealed, and a heat transfer member is thermally connected to a heat insulating part located between the heat receiving part and the heat radiating part of the heat transport member.

5 Claims, 4 Drawing Sheets

(58) Field of Classification Search
USPC ........................................................ 165/80.3
See application file for complete search history.

(56) References Cited

U.S. PATENT DOCUMENTS

| | | | | |
|---|---|---|---|---|
| 7,443,677 | B1 * | 10/2008 | Zhou | H10W 40/73 361/679.48 |
| 7,613,001 | B1 * | 11/2009 | Liu | H05K 7/20336 361/679.52 |
| 10,119,759 | B2 * | 11/2018 | Watanabe | F26B 3/26 |
| 10,371,457 | B2 * | 8/2019 | Chen | F28D 15/0275 |
| 10,598,441 | B2 * | 3/2020 | Kawabata | F28D 15/0275 |
| 10,677,535 | B1 * | 6/2020 | Kawabata | F28D 15/04 |
| 10,760,855 | B2 * | 9/2020 | Watanabe | F28D 15/04 |
| 10,809,011 | B2 * | 10/2020 | Chu | F28D 15/0275 |
| 11,085,703 | B2 * | 8/2021 | Watanabe | F28D 15/0233 |
| 11,112,186 | B2 * | 9/2021 | Watanabe | F28D 15/0275 |
| 11,817,372 | B2 * | 11/2023 | Lin | H10W 40/73 |
| 12,173,966 | B2 * | 12/2024 | Kubo | F28D 15/0266 |
| 2013/0014920 | A1 * | 1/2013 | Chao | F28D 15/0275 165/185 |
| 2018/0017335 | A1 * | 1/2018 | Lin | F28D 15/0275 |
| 2019/0323779 | A1 * | 10/2019 | Kawabata | F28D 15/0275 |
| 2020/0393201 | A1 | 12/2020 | Watanabe et al. | |
| 2021/0007246 | A1 * | 1/2021 | Watanabe | H05K 7/20336 |
| 2021/0033356 | A1 * | 2/2021 | Chen | F28F 1/22 |
| 2023/0013442 | A1 * | 1/2023 | Lan | H05K 7/20336 |

FOREIGN PATENT DOCUMENTS

| | | | |
|---|---|---|---|
| EP | 3 758 057 | A1 | 12/2020 |
| JP | 61-125531 | A | 6/1986 |
| JP | 7-63487 | A | 3/1995 |
| JP | 2005-9752 | A | 1/2005 |
| JP | 2020-176752 | A | 10/2020 |
| TW | I289041 | I | 10/2007 |

OTHER PUBLICATIONS

International Preliminary Report on Patentability dated Oct. 10, 2024 from corresponding International Patent Application No. PCT/JP2023/006683, 11 pages.

Japanese Notice of Reasons for Refusal dated Sep. 25, 2023 from corresponding Japanese Patent Application No. 2023-532349, 8 pages.

Taiwan Notice of the Opinion on Examination dated Nov. 23, 2023 from corresponding Taiwan Patent Application No. 112107744, 14 pages.

Chinese First Notice of Examination Opinion dated Sep. 18, 2024 from corresponding Chinese Patent Application No. 2023900000126. 1, 4 pages.

* cited by examiner

HEAT SINK

CROSS REFERENCE TO RELATED APPLICATIONS

The present application is a continuation application of International Patent Application No. PCT/JP2023/006683 filed on Feb. 24, 2023, which claims the benefit of Japanese Patent Application No. 2022-054633, filed on Mar. 29, 2022. The contents of these applications are incorporated herein by reference in their entirety.

BACKGROUND

Technical Field

The present disclosure relates to a heat sink that cools a heat generating body, such as an electric/electronic component.

Background

Due to advanced features of electronic equipment, a large number of components including heat generating bodies, such as electronic components, are mounted in the electronic equipment at a high density. Further, an amount of heat generation by the heat generating bodies, such as the electronic components, increases due to the advanced features of the electronic equipment. There may be cases in which a heat pipe having an inner space in which a pressure is reduced and a working fluid is sealed, a vapor chamber having an inner space in which a pressure is reduced and a working fluid is sealed, or a heat sink including the above-mentioned heat pipe or vapor chamber is used as a unit configured to cool the heat generating bodies, such as the electronic components, in the electronic equipment.

When an environmental temperature at the time of use of the heat sink or the vapor chamber is lower than a melting point of the working fluid, the working fluid sealed in the inner space of the heat sink or the vapor chamber is in a frozen state. Accordingly, in a case in which the environmental temperature at the time of use of the heat sink or the vapor chamber is lower than the melting point of the working fluid, when the heat sink or the vapor chamber receives heat from the heat generating body, which is a cooling target, the heat sink or the vapor chamber starts up with the working fluid being in a frozen state.

As shown in FIG. 5, in a conventional heat sink 101, when a heat transport part 110, such as a heat sink or a vapor chamber, receives heat of a predetermined heat quantity Qin from a heat generating body 100 at a heat receiving part 141 with a working fluid being in a frozen state, a frozen solid-phase working fluid 200 changes phase to become a gas-phase working fluid 201 at the heat receiving part 141. The gas-phase working fluid 201 flows from the heat receiving part 141 to a heat radiating part 143 of the heat transport part 110, to which a heat radiating fin group 120 is thermally connected, via a heat insulating part 142 of the heat transport part 110. After the gas-phase working fluid 201 flows to the heat radiating part 143, the gas-phase working fluid 201 changes phase to become a liquid-phase working fluid 202 due to a heat exchange action of the heat radiating fin group 120, and releases a predetermined heat quantity Qout as latent heat.

However, when the environmental temperature at the time of use of the heat sink 101 is lower than the melting point of the working fluid, the liquid-phase working fluid 202 freezes, thus changes phase to become the solid-phase working fluid 200 at the heat radiating part 143. When the liquid-phase working fluid 202 is frozen at the heat radiating part 143, the working fluid cannot reflux from the heat radiating part 143 to the heat receiving part 141, so that dryout occurs in the heat transport part 110.

Japanese Patent Laid-Open No. 2020-176752 (Patent Literature 1) proposes a heat sink in which a heat transport part receives heat from a heat generating body at a heat receiving part, a working fluid changes phase to become a gas-phase working fluid at the heat receiving part, the gas-phase working fluid flows from the heat receiving part to a heat radiating part of the heat transport part, to which a heat radiating fin group is thermally connected, via a heat insulating part of the heat transport part, and the gas-phase working fluid that flows to the heat radiating part changes phase to become a liquid-phase working fluid due to a heat exchange action of the heat radiating fin group, thus releasing latent heat.

In Patent Literature 1, an intermediate portion located between the heat receiving part, which is located at one end of a heat transport member, and the heat radiating part, which is located at another end of the heat transport member, serves as the heat insulating part. The heat insulating part is a portion to which neither the heat radiating fin group nor the heat generating body is thermally connected. Accordingly, in the heat sink of Patent Literature 1, the heat insulating part is a portion at which neither active heat input into the heat transport member nor active heat radiation from the heat transport member is performed.

In view of the above, to prevent freezing of a working fluid, a technique is proposed that uses water containing glycols as the working fluid for the heat pipe (Japanese Patent Laid-Open No. 2005-009752). In Japanese Patent Laid-Open No. 2005-009752 (Patent Literature 2), water containing glycols is used as the working fluid and hence, a melting point is lower than that of pure water. Therefore, even when an environmental temperature at the time of use of a heat sink or a vapor chamber is used is low, the working fluid does not freeze and refluxes from the heat radiating part to the heat receiving part, thus preventing dryout.

However, in Patent Literature 2, an organic solvent, such as glycols, is mixed into the working fluid, thus reducing heat transfer characteristics of the heat pipe. Further, in Patent Literature 2, an organic solvent is sealed in the inner space of the heat pipe, thus reducing long-term reliability of heat transfer characteristics.

SUMMARY

The present disclosure is related to providing a heat sink that can prevent dryout without impairing heat transfer characteristics even when an environmental temperature at the time of use is lower than a melting point of a working fluid.

The gist of the configuration of a heat sink of the present disclosure is as follows.

[1] A heat sink including:

a heat transport member including a heat receiving part thermally connected to a heat generating body; and a first heat radiating fin group in which a plurality of first heat radiating fins are arranged, the first heat radiating fin group being thermally connected to the heat transport member at a heat radiating part, wherein the heat transport member has a first inner space that communicates from the heat receiving part to the heat radiating part and in which a first working fluid is sealed, and a heat transfer member is thermally connected to a heat insulating part located between the heat receiving part and the heat radiating part of the heat transport member.

[2] The heat sink described in [1], wherein the heat transfer member is formed by a heat exchange member.

[3] The heat sink described in [2], wherein the heat exchange member is formed by a second heat radiating fin group in which a plurality of second heat radiating fins are arranged.

[4] The heat sink described in [3], wherein a fin area of the second heat radiating fin group is smaller than a fin area of the first heat radiating fin group.

[5] The heat sink described in [1], wherein the heat transfer member is formed by a heat pipe having a second inner space in which a second working fluid is sealed.

[6] The heat sink described in [5], wherein the heat pipe extends from the heat insulating part to the heat receiving part.

[7] The heat sink described in any one of [1] to [6], wherein the heat transfer member is disposed with a predetermined space from the first heat radiating fin group.

[8] The heat sink described in any one of [1] to [7], wherein an inner space of the heat transport member is an integral space.

[9] The heat sink described in any one of [1] to [8], wherein the heat radiating part of the heat transport member has a larger width than the heat receiving part.

In the above-mentioned aspects, of the heat transport member, a portion thermally connected to the heat generating body, which is a cooling target, serves as the heat receiving part, and a portion thermally connected to the first heat radiating fins serves as the heat radiating part of the heat transport member. Further, of the heat transport member, a portion between the heat receiving part and the heat radiating part serves as the heat insulating part, and the heat transfer member is thermally connected to the heat insulating part. At the heat receiving part of the heat transport member, a working fluid (first working fluid) receives heat from the heat generating body, thus changing phase from a liquid phase to a gas phase. At the heat radiating part of the heat transport member, the gas-phase working fluid releases latent heat, thus changing phase from a gas phase to a liquid phase. In the above-mentioned aspects, the gas-phase working fluid flows from the heat receiving part to the heat radiating part of the heat transport member via the heat insulating part, and the liquid-phase working fluid flows from the heat radiating part to the heat receiving part of the heat transport member via the heat insulating part. Accordingly, heat of the heat generating body is transported, by the heat transport member, from the heat receiving part of the heat transport member to the heat radiating part of the heat transport member via the heat insulating part.

In the above-mentioned aspects, the heat transfer member is thermally connected to the heat insulating part and hence, when heat of the heat generating body is transported from the heat receiving part of the heat transport member to the heat radiating part of the heat transport member via the heat insulating part, the heat is inputted into the heat sink also at the heat insulating part, or the heat is radiated from the heat sink also at the heat insulating part. That is, in the heat sink of the present disclosure, the heat insulating part is a portion at which active heat input into the heat transport member or active heat radiation from the heat transport member is performed.

In the aspects of the heat sink of the present disclosure, the heat transfer member is thermally connected to the heat insulating part located between the heat receiving part and the heat radiating part of the heat transport member and hence, due to a heat transfer action of the heat transfer member, heat is inputted into the heat transport member at the heat insulating part or heat is radiated from the heat transport member at the heat insulating part. Therefore, the working fluid (first working fluid) receives heat at the heat insulating part, or heat is released from the working fluid at the heat insulating part. The liquid-phase working fluid receives heat at the heat insulating part and hence, the liquid-phase working fluid sealed in the heat transport member receives heat within a range from the heat receiving part to the heat insulating part, thus preventing freezing of the liquid-phase working fluid sealed in the heat transport member at the heat insulating part and at the heat radiating part, which is disposed adjacent to the heat insulating part. Further, heat is released from the gas-phase working fluid at the heat insulating part and hence, a portion of the gas-phase working fluid changes phase from a gas phase to a liquid phase at the heat insulating part, which is disposed adjacent to the heat receiving part, instead of changing phase at the heat radiating part. Since the portion of the gas-phase working fluid flowing through the heat insulating part changes phase to a liquid phase, a portion of a liquid-phase working fluid has a shortened reflux distance to the heat receiving part. As a result, the reflux of the liquid-phase working fluid to the heat receiving part is smoothed. Further, the portion of the gas-phase working fluid changes phase from a gas phase to a liquid phase at the heat insulating part instead of changing phase at the heat radiating part where the liquid-phase working fluid is more likely to freeze than at the heat receiving part or the heat insulating part and hence, freezing of the liquid-phase working fluid is prevented.

Due to the above, according to the aspects of the heat sink of the present disclosure, it is possible to prevent dryout in the heat transport member without impairing heat transfer characteristics even when the environmental temperature at the time of use is lower than the melting point of the working fluid.

According to the aspects of the heat sink of the present disclosure, the heat transfer member is formed by the heat exchange member, and the heat exchange member is formed by the second heat radiating fin group, in which the plurality of second heat radiating fins are arranged. With such a configuration, heat is smoothly released from the gas-phase working fluid flowing through the heat insulating part due to a heat exchange action of the second heat radiating fin group and hence, a phase change of the gas-phase working fluid to a liquid phase is smoothed at heat insulating part. Accordingly, according to the aspects of the heat sink of the present disclosure, the reflux of the liquid-phase working fluid to the heat receiving part is further smoothed. Further, freezing of the liquid-phase working fluid is surely prevented and hence, even when the environmental temperature at the time of use is lower than the melting point of the working fluid, it is possible to more surely prevent dryout in the heat transport member.

According to the aspects of the heat sink of the present disclosure, the fin area of the second heat radiating fin group, forming the heat transfer member, is smaller than the fin area of the first heat radiating fin group thermally connected to the heat radiating part and hence, it is possible to prevent excessive promotion of heat radiation from the heat sink at the heat insulating part. Accordingly, even when the environmental temperature at the time of use is lower than the melting point of the working fluid, it is possible to more surely prevent dryout in the heat transport member.

According to the aspects of the heat sink of the present disclosure, the heat transfer member is formed by the heat pipe having the inner space (second inner space) in which the working fluid (second working fluid) is sealed and hence, heat transfer to the heat insulating part of the heat transport member is smoothed, and reception of heat by the liquid-phase working fluid sealed in the heat transport member is promoted at the heat insulating part. Therefore, freezing of the liquid-phase working fluid in the heat transport member is more surely prevented at the heat insulating part and at the heat radiating part, which is disposed adjacent to the heat insulating part. Accordingly, according to the aspects of the heat sink of the present disclosure, even when the environmental temperature at the time of use is lower than the melting point of the working fluid, it is possible to more surely prevent dryout in the heat transport member.

According to the aspects of the heat sink of the present disclosure, the heat pipe extends from the heat insulating part to the heat receiving part of the heat transport member and hence, heat transport from the heat receiving part to the heat insulating part of the heat transport member is promoted by the heat pipe, forming the heat transfer member. Accordingly, an amount of heat received by the liquid-phase working fluid in the heat transport member is surely increased at the heat insulating part and hence, freezing of the liquid-phase working fluid in the heat transport member is further surely prevented at the heat insulating part and at the heat radiating part, which is disposed adjacent to the heat insulating part.

According to the aspects of the heat sink of the present disclosure, the heat transfer member is disposed with a predetermined space from the first heat radiating fin group and hence, it is possible to prevent excessive promotion of heat radiation from the entire heat sink. Accordingly, even when the environmental temperature at the time of use is lower than the melting point of the working fluid, it is possible to more surely prevent dryout in the heat transport member.

According to the aspects of the heat sink of the present disclosure, the inner space of the heat transport member is an integral space and hence, even when non-uniform heat generation occurs in the heat generating body, it is possible to uniformly cool the entire heat generating body.

DETAILED DESCRIPTION

Figure 1:
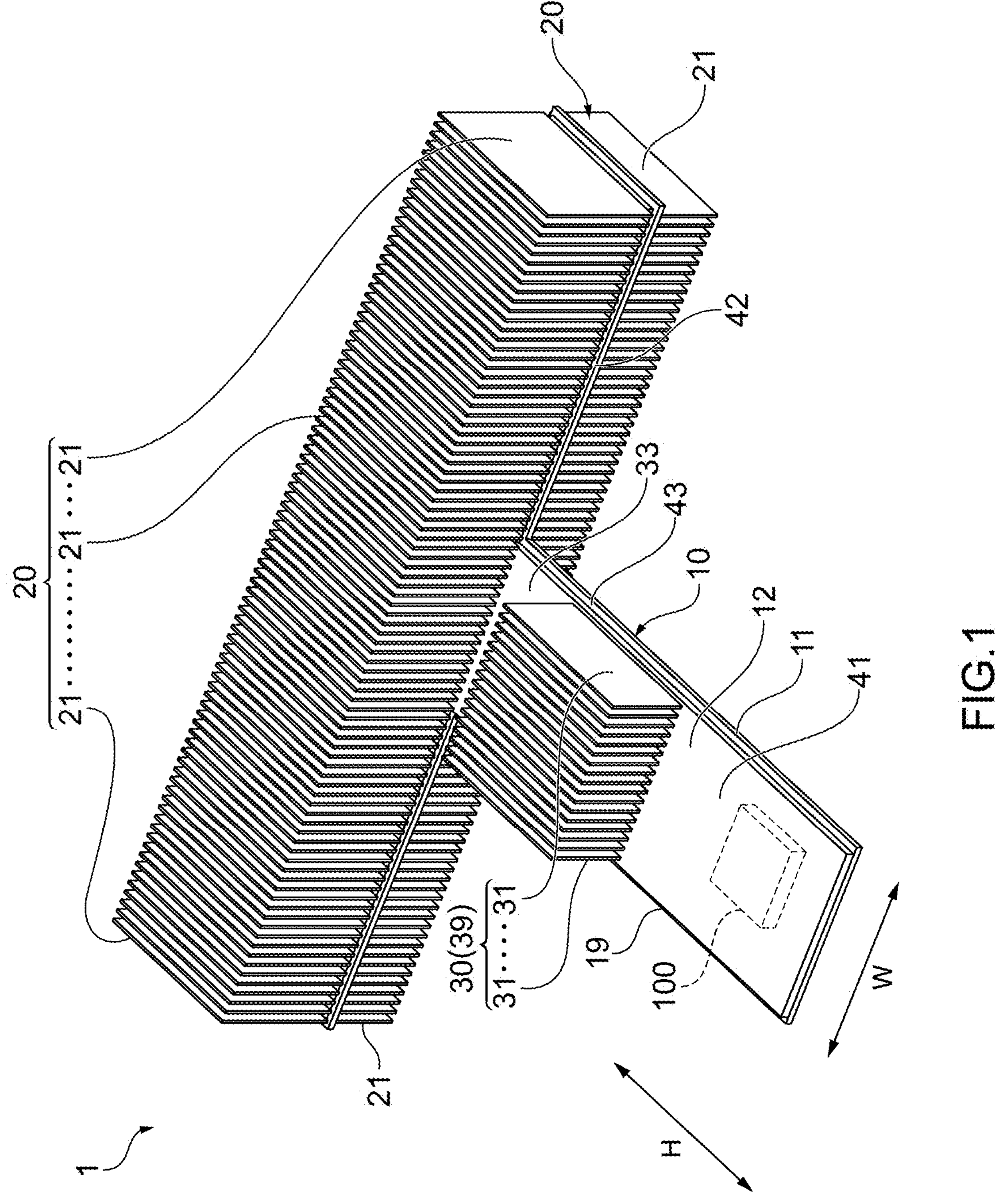
FIG. 1 is a perspective view illustrating a summary of a heat sink according to a first embodiment of the present disclosure.
Figure 2:
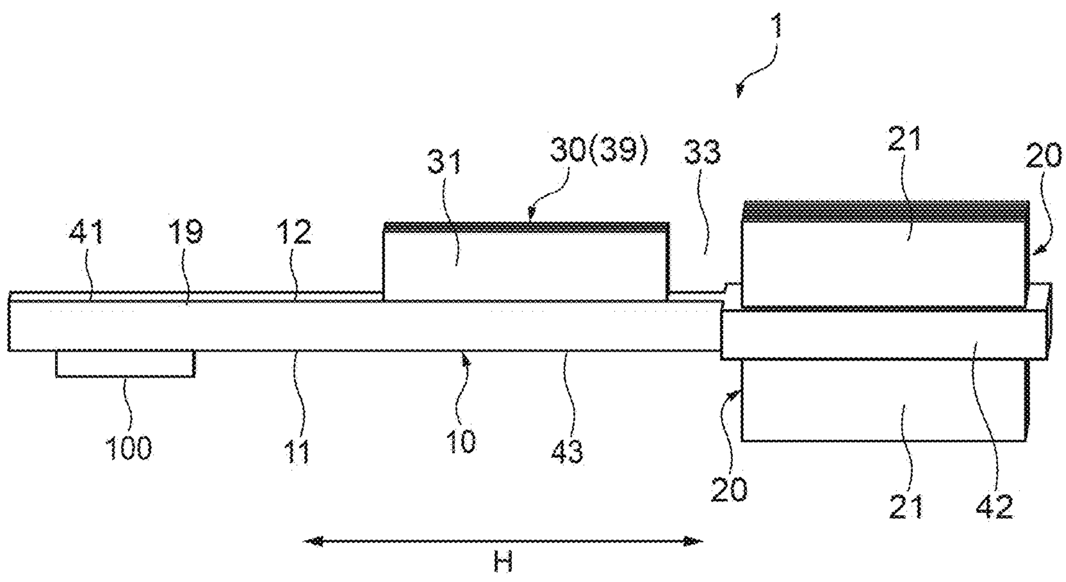
FIG. 2 is a side view illustrating a summary of the heat sink according to the first embodiment of the present disclosure.

Hereinafter, heat sinks according to embodiments of the present disclosure will be described with reference to accompanying drawings. First, a heat sink according to a first embodiment of the present disclosure will be described. FIG. 1 is a perspective view illustrating a summary of the heat sink according to the first embodiment of the present disclosure. FIG. 2 is a side view illustrating a summary of the heat sink according to the first embodiment of the present disclosure.

As shown in FIGS. 1, 2, a heat sink 1 according to the first embodiment of the present disclosure includes a heat transport member 10 and first heat radiating fin groups 20, the heat transport member 10 including a heat receiving part (evaporating part) 41 thermally connected to a heat generating body 100, the first heat radiating fin groups 20 being thermally connected to the heat transport member 10. In the heat sink 1, one heat transport member 10 is provided. A portion of the heat transport member 10 to which the first heat radiating fin groups 20 are thermally connected forms a heat radiating part (condensing part) 42. At the heat radiating part 42 of the heat transport member 10, the first heat radiating fin groups 20 are thermally connected to the heat transport member 10.

The heat transport member 10 includes a container 19 having a hollow cavity portion, and a working fluid (first working fluid) that flows through the cavity portion. A wick structure (not shown in the drawing) having a capillary force is housed in the cavity portion. The container 19 is formed by making one plate-like body 11 and another plate-like body 12, which faces the one plate-like body 11, overlap with each other.

The one plate-like body 11 has a plate shape including side walls at an edge portion of a flat surface portion, the side walls being erected from the flat surface portion. The other plate-like body 12 also has a plate shape including side walls at an edge portion of a flat surface portion, the side walls being erected from the flat surface portion. Accordingly, each of the one plate-like body 11 and the other plate-like body 12 has a recessed shape. By making the one plate-like body 11 having a recessed shape and the other plate-like body 12 having a recessed shape overlap with each other, the container 19 having the cavity portion is formed. Accordingly, a type of the container 19 is a planar type, and the heat transport member 10 has a configuration of a vapor chamber. The cavity portion, which is an inner space of the container 19 (a first inner space), is sealed relative to an external environment, and a pressure in the cavity portion is reduced by performing a degassing process.

An inner space of the heat transport member 10 communicates from the heat receiving part 41 to the heat radiating part 42, and the working fluid is sealed in the inner space of the heat transport member 10. The entire inner space of the heat transport member 10 is an integral space.

Of an outer surface of the container 19, a portion to which the heat generating body 100, which is a cooling target, is thermally connected forms the heat receiving part 41. The heat generating body 100 is thermally connected to the container 19 and hence, the heat generating body 100 is cooled due to the cooling action of the heat sink 1. In the heat transport member 10, the heat generating body 100 is thermally connected to one end and hence, the heat receiving part 41 is formed at the one end. Of the outer surface of the container 19, the heat generating body 100 is thermally connected to the one plate-like body 11.

The heat transport member 10 extends in a predetermined direction from a position of the heat generating body 100, and the first heat radiating fin groups 20 are thermally connected to another end that faces one end of the container 19. Another end of the heat transport member 10, to which the first heat radiating fin groups 20 are thermally connected, serves as the heat radiating part 42 of the heat transport member 10.

The heat radiating part 42 of the heat transport member 10 has a larger width than the heat receiving part 41. In the heat sink 1, the heat radiating part 42 of the heat transport member 10 extends in a direction (width direction W) substantially orthogonal to a heat transport direction H of the heat transport member 10 along a plane direction of the heat transport member 10. The heat radiating part 42 of the heat transport member 10 extends in two directions. In the heat sink 1, an extending direction of the heat radiating part 42 is not parallel to the heat transport direction H of the heat transport member 10 and hence, heat transported from the heat transport member 10 is diffused by the heat radiating part 42 in directions different from an extending direction of the heat transport member 10. Accordingly, it is possible to prevent an increase in dimension of the heat sink 1 in the heat transport direction H of the heat transport member 10 and hence, a space for the heat sink 1 can be saved. Further, the heat radiating part 42 of the heat transport member 10 has a larger width than the heat receiving part 41 and hence, it is possible to increase the number of first heat radiating fins 21 installed and forming the first heat radiating fin groups 20.

In the heat transport member 10, an intermediate portion in the heat transport direction H located between the heat receiving part 41, which is located at one end of the container 19, and the heat radiating part 42, which is located at the other end of the container 19, serves as a heat insulating part 43. The heat insulating part 43 is a portion to which neither the first heat radiating fin group 20 nor the heat generating body 100 is thermally connected. Heat transmitted from the heat generating body 100 to the heat receiving part 41 is transported from the heat receiving part 41 to the heat radiating part 42 via the heat insulating part 43 along the extending direction of the heat transport member 10.

In the heat sink 1, a dimension of the heat insulating part 43 in the width direction W is substantially equal to a dimension of the heat receiving part 41 in the width direction W. In the heat transport member 10, the heat receiving part 41, the heat insulating part 43, and the heat radiating part 42 extend along the same plane.

In the heat sink 1, a plurality of first heat radiating fins 21, 21, 21 . . . erected on an outer surface of the heat radiating part 42 are arranged in the first heat radiating fin group 20. The plurality of first heat radiating fins 21, 21, 21 . . . are arranged in parallel at predetermined intervals along the heat radiating part 42, which extends in the direction substantially orthogonal to the heat transport direction H of the heat transport member 10, to form the first heat radiating fin group 20. In the heat sink 1, heights of the plurality of first heat radiating fins 21, 21, 21 . . . , forming the first heat radiating fin group 20, are substantially equal to each other.

In the heat sink 1, the first heat radiating fin group 20 is provided to each of the one plate-like body 11 and the other plate-like body 12 of the container 19. Due to the above, at the other end of the heat transport member 10 in the heat transport direction H, the first heat radiating fins 21 are thermally connected to the container 19 in a state of being divided for both surfaces (that is, the one plate-like body 11 and the other plate-like body 12) of the container 19.

As shown in FIGS. 1, 2, in the heat sink 1, a heat transfer member 39 is thermally connected to the heat insulating part 43, located between the heat receiving part 41 and the heat radiating part 42 of the heat transport member 10. In the heat sink 1, a heat exchange member is used as the heat transfer member 39. Specifically, a second heat radiating fin group 30, in which a plurality of second heat radiating fins 31, 31, 31 . . . are arranged, is provided as the heat exchange member.

The second heat radiating fins 31 are erected on an outer surface of the heat insulating part 43 of the heat transport member 10, so that the second heat radiating fins 31 are thermally connected to the container 19. Due to the above, in the heat sink 1, the heat insulating part 43 is a portion at which active heat radiation from the heat transport member 10 is performed. Of the heat insulating part 43 of the heat transport member 10, the second heat radiating fins 31 are erected on the other plate-like body 12 of the container 19. The second heat radiating fins 31 are erected on the outer surface of the heat insulating part 43 such that main surfaces of the second heat radiating fins 31 are substantially parallel to main surfaces of the first heat radiating fins 21. The plurality of second heat radiating fins 31 are arranged in parallel at predetermined intervals along the width direction W of the heat transport member 10. The plurality of second heat radiating fins 31, 31, 31 . . . are arranged in parallel to form the second heat radiating fin group 30. In the heat sink 1, heights of the plurality of second heat radiating fins 31, 31, 31 . . . forming the second heat radiating fin group 30 are substantially equal to each other. In the heat sink 1, the height of the second heat radiating fins 31 is lower than the height of the first heat radiating fins 21.

In contrast, of the heat insulating part 43 of the heat transport member 10, the second heat radiating fins 31 are not erected on the one plate-like body 11 of the container 19. The second heat radiating fins 31, forming the heat transfer member 39, are not provided to the heat receiving part 41 of the heat transport member 10.

In the heat sink 1, a fin area of the second heat radiating fin group 30 is smaller than a fin area of the first heat radiating fin group 20. That is, a total of fin areas of all second heat radiating fins 31, 31, 31 . . . , forming the second heat radiating fin group 30, is smaller than a total of fin areas of all first heat radiating fins 21, 21, 21 . . . , forming the first heat radiating fin group 20. Due to the above, a structure is adopted in which an amount of heat radiation from the second heat radiating fin group 30 is smaller than an amount of heat radiation from the first heat radiating fin group 20. That is, a structure is adopted in which a cooling characteristic of the first heat radiating fin group 20 forming the heat radiating part 42 is higher than a cooling characteristic of the second heat radiating fin group 30, forming the heat transfer member 39 provided to the heat insulating part 43. Due to the above, in the heat sink 1, the heat radiating part 42 and the heat insulating part 43 differ from each other in function and structure with respect to a point that a cooling characteristic of the heat radiating part 42 is higher than a cooling characteristic of the heat insulating part 43.

The fin area means an area of the main surface of the heat radiating fin (the first heat radiating fin 21, the second heat radiating fin 31) having a thin plate shape.

In the heat sink 1, the fin area of each second heat radiating fin 31 is smaller than the fin area of each first heat radiating fin 21. In the heat sink 1, the number of second heat radiating fins 31 installed is smaller than the number of first heat radiating fins 21 installed. The fin area of each second heat radiating fin 31 may be larger than or equivalent to the fin area of each first heat radiating fin 21, or the number of second heat radiating fins 31 installed may be larger than or equal to the number of first heat radiating fins 21 installed provided that the total of the fin areas of all second heat radiating fins 31, 31, 31 . . . , forming the second heat radiating fin group 30, is smaller than the total of the fin areas of all first heat radiating fins 21, 21, 21 . . . , forming the first heat radiating fin group 20.

In the heat sink 1, the second heat radiating fin group 30, forming the heat transfer member 39, is disposed with a predetermined space 33 from the first heat radiating fin group 20. Accordingly, the second heat radiating fin group 30 is not continuously provided to the first heat radiating fin group 20. Neither the heat transfer member 39 nor the first heat radiating fin group 20 is provided at a boundary portion between the heat insulating part 43 and the heat radiating part 42 of the heat transport member 10. The heat transfer member 39 is not provided to a portion of the heat insulating part 43 of the heat transport member 10 in the vicinity of the heat radiating part 42.

In the heat sink 1, heat of the heat generating body 100 is transported from the heat receiving part 41 to the heat radiating part 42, to which the first heat radiating fin groups 20 are thermally connected, via the heat insulating part 43, to which the second heat radiating fin group 30, forming the heat transfer member 39, is thermally connected, and the heat of the heat generating body 100 is then released to an external environment due to a heat exchange action of the first heat radiating fin group 20 at the heat radiating part 42. A portion of the heat of the heat generating body 100 is released to the external environment due to a heat exchange action of the second heat radiating fin group 30 at the heat insulating part 43.

The wick structure (not shown in the drawing) that generates a capillary force is provided to the cavity portion of the container 19. The wick structure is provided throughout the entire inner surface of the container 19, for example. Due to the capillary force of the wick structure, the working fluid, the phase of which is changed from a gas phase to a liquid phase at the heat radiating part 42 of the heat transport member 10, refluxes from the heat radiating part 42 to the heat receiving part 41 of the heat transport member 10 via the heat insulating part 43. Further, due to the capillary force of the wick structure, the working fluid, the phase of which is changed from a gas phase to a liquid phase at the heat insulating part 43 of the heat transport member 10, refluxes from the heat insulating part 43 to the heat receiving part 41 of the heat transport member 10.

The wick structure is not particularly limited. However, examples of the wick structure may include a sintered body made of metal powder, such as copper powder, a metal mesh made of metal wires, non-woven fabric, grooves (a plurality of narrow grooves) or the like formed on an inner surface of the container 19, and a combination of the above.

Due to a vapor flow path (not shown in the drawing), a gas-phase working fluid can flow throughout the entire container 19. The vapor flow path is formed by the inner space of the container 19, and extends throughout the entire container 19. To maintain the inner space of the container 19 on which a pressure reduction process is performed, pillars (not shown in the drawing), forming support portions, may be provided to the vapor flow path when necessary. The pillar is not particularly limited. However, to reduce a resistance in the flow path when a liquid-phase working fluid refluxes, examples of the pillar may include a composite pillar in which the periphery of a metal member (a copper member, for example) having a columnar shape is covered by the wick structure, and a sintered body having a columnar shape and made of metal powder, such as copper powder.

Examples of a material of the container 19 may include stainless steel, copper, copper alloy, aluminum, aluminum alloy, tin, tin alloy, titanium, titanium alloy, nickel, and nickel alloy. A material of the first heat radiating fins 21 and the second heat radiating fins 31 is not particularly limited, and examples of the material of the first heat radiating fins 21 and the second heat radiating fins 31 include metal materials, such as copper, copper alloy, aluminum, and aluminum alloy.

The working fluid to be sealed in the inner space of the container 19 may be suitably selectable according to compatibility with the material of the container 19, and an example of the working fluid may include water.

The heat sink 1 may be forcibly air-cooled by a blower fan (not shown in the drawing) when necessary. Cooling air from the blower fan is supplied along the main surfaces of the first heat radiating fins 21 and hence, cooling of the first heat radiating fin groups 20 is promoted.

Next, a mechanism of a cooling function of the heat sink 1 will be described. First, the heat generating body 100, which is an object to be cooled, is thermally connected to one end of the container 19 of the heat transport member 10. When the heat transport member 10 receives heat from the heat generating body 100 at the heat receiving part 41 located at the one end of the container 19, the heat is transmitted, at the heat receiving part 41 of the heat transport member 10, from the heat generating body 100 to a liquid-phase working fluid sealed in the inner space of the container 19, so that the liquid-phase working fluid changes phase to become a gas-phase working fluid. The gas-phase working fluid obtained by changing phase flows through the vapor flow path from the heat receiving part 41 of the heat transport member 10 to the heat radiating part 42, which is located at the other end of the container 19, via the heat insulating part 43, which is located at a center portion of the heat transport member 10. The gas-phase working fluid flows from the heat receiving part 41, which is located at the one end of the container 19, to the heat radiating part 42, which is located at the other end of the container 19, via the heat insulating part 43 and hence, the heat from the heat generating body 100 is transported from one end to the other end of the heat transport member 10. After the gas-phase working fluid flows from the one end to the other end of the heat transport member 10, the gas-phase working fluid releases latent heat due to the heat exchange action of the first heat radiating fin groups 20, thus changing phase from a gas phase to a liquid phase. The released latent heat is transmitted to the first heat radiating fin groups 20, which are thermally connected to the heat radiating part 42 of the heat transport member 10. The heat transmitted from the container 19 to the first heat radiating fin groups 20 is released to an environment external to the heat sink 1 via the first heat radiating fin groups 20. Due to the capillary force of the wick structure provided to the container 19, the working fluid, the phase of which is changed from a gas phase to a liquid phase due to a release of latent heat, refluxes from the heat radiating part 42 to the heat receiving part 41 of the heat transport member 10 via the heat insulating part 43.

In the heat sink 1, when a gas-phase working fluid flows from the heat receiving part 41 to the heat insulating part 43 of the heat transport member 10, a portion of the gas-phase working fluid releases latent heat at the heat insulating part 43 due to a heat exchange action of the second heat radiating fin group 30, forming the heat transfer member 39, so that the gas-phase working fluid changes phase from a gas phase to a liquid phase. The released latent heat is transmitted to the second heat radiating fin group 30, which is thermally connected to the heat insulating part 43 of the heat transport member 10. The heat transmitted from the container 19 to the second heat radiating fin group 30 is released to an environment external to the heat sink 1 via the second heat radiating fin group 30. Due to the capillary force of the wick structure provided to the container 19, the working fluid, the phase of which is changed from a gas phase to a liquid phase due to a release of latent heat at the heat insulating part 43, refluxes from the heat insulating part 43 to the heat receiving part 41 of the heat transport member 10.

In the heat sink 1 according to the first embodiment of the present disclosure, the second heat radiating fin group 30, forming the heat transfer member 39, is thermally connected to the heat insulating part 43 located between the heat receiving part 41 and the heat radiating part 42 of the heat transport member 10 and hence, heat is radiated from the heat sink 1 at the heat insulating part 43 due to the heat exchange action of the second heat radiating fin group 30. Therefore, the heat is released from the working fluid at the heat insulating part 43. The heat is released from the gas-phase working fluid at the heat insulating part 43 and hence, a portion of the gas-phase working fluid changes phase from a gas phase to a liquid phase at the heat insulating part 43, which is disposed adjacent to the heat receiving part 41, instead of changing phase at the heat radiating part 42. Since the portion of the gas-phase working fluid flowing through the heat insulating part 43 changes phase to a liquid phase, a portion of a liquid-phase working fluid has a shortened reflux distance to the heat receiving part 41 than a working fluid that changes phase from a gas phase to a liquid phase at the heat radiating part 42. As a result, the reflux of the liquid-phase working fluid to the heat receiving part 41 is smoothed. Further, the portion of the gas-phase working fluid changes phase from a gas phase to a liquid phase at the heat insulating part 43 instead of changing phase at the heat radiating part 42 where the liquid-phase working fluid is more likely to freeze than at the heat receiving part 41 or the heat insulating part 43 and hence, freezing of the liquid-phase working fluid is prevented. Accordingly, according to the aspect of the heat sink 1, it is possible to prevent dryout in the heat transport member 10 without impairing heat transfer characteristics even when an environmental temperature at the time of use is lower than a melting point of the working fluid.

In the heat sink 1, the heat transfer member 39 is formed by the second heat radiating fin group 30. With such a configuration, heat is smoothly released from the gas-phase working fluid flowing through the heat insulating part 43 due to the heat exchange action of the second heat radiating fin group 30 and hence, a phase change of the gas-phase working fluid to a liquid phase is smoothed at the heat insulating part 43. Accordingly, in the heat sink 1, the reflux of the liquid-phase working fluid to the heat receiving part 41 is further smoothed. Further, freezing of the liquid-phase working fluid is surely prevented and hence, even when the environmental temperature at the time of use is lower than the melting point of the working fluid, it is possible to more surely prevent dryout in the heat transport member 10.

In the heat sink 1, the fin area of the second heat radiating fin group 30 is smaller than the fin area of the first heat radiating fin group 20, which is thermally connected to the heat radiating part 42 and hence, it is possible to prevent excessive promotion of heat radiation from the heat sink 1 at the heat insulating part 43. Accordingly, even when the environmental temperature at the time of use is lower than the melting point of the working fluid, it is possible to more surely prevent dryout in the heat transport member 10.

In the heat sink 1, the second heat radiating fin group 30, forming the heat transfer member 39, is disposed with the predetermined space 33 from the first heat radiating fin group 20 and hence, it is possible to prevent excessive promotion of heat radiation from the entire heat sink 1. Accordingly, even when the environmental temperature at the time of use is lower than the melting point of the working fluid, it is possible to more surely prevent dryout in the heat transport member 10.

In the heat sink 1, the inner space of the heat transport member 10 is an integral space and hence, even when non-uniform heat generation occurs in the heat generating body 100, it is possible to uniformly cool the entire heat generating body 100.

Figure 3:
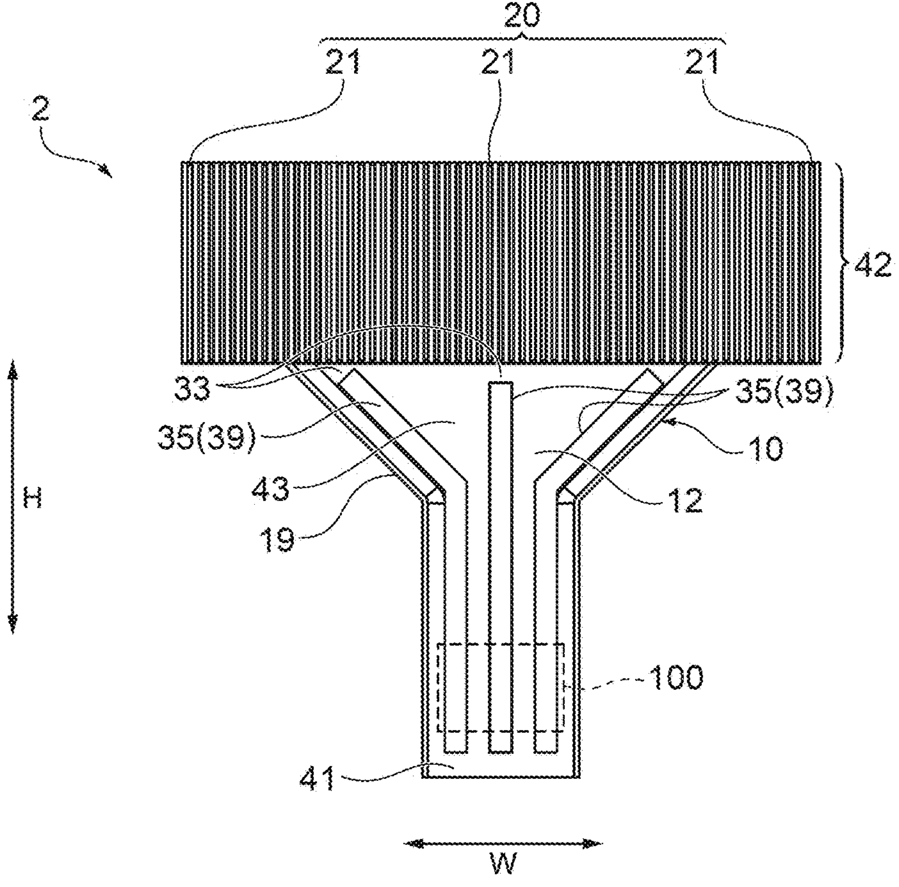
FIG. 3 is a plan view illustrating a summary of a heat sink according to a second embodiment of the present disclosure.

Next, the detail of a heat sink according to a second embodiment of the present disclosure will be described. Main constitutional elements of the heat sink according to the second embodiment are identical to the corresponding main constitutional elements of the heat sink according to the first embodiment and hence, the constitutional elements identical to the corresponding constitutional elements of the heat sink according to the first embodiment will be described by using the same reference symbols. FIG. 3 is a plan view illustrating a summary of the heat sink according to the second embodiment of the present disclosure.

In the heat sink 1 according to the first embodiment, the second heat radiating fin group 30, which is the heat exchange member, is provided to the heat insulating part 43 as the heat transfer member 39. However, instead of such a configuration, in a heat sink 2 according to the second embodiment of the present disclosure, as shown in FIG. 3, heat pipes 35 are thermally connected to a heat insulating part 43 as a heat transfer member 39, each heat pipe 35 having an inner space (a second inner space) in which a working fluid (a second working fluid) is sealed. In the heat sink 2, a plurality (three in FIG. 3) heat pipes 35, 35, 35 . . . are thermally connected to an outer surface of the heat insulating part 43. The plurality of heat pipes 35, 35, 35 . . . are arranged in parallel along a width direction W of a heat transport member 10. Of the heat insulating part 43 of the heat transport member 10, the heat pipes 35 are attached to an outer surface of another plate-like body 12 along a plane direction of the container 19.

Each heat pipe 35 is a tubular body. The inner space of the heat pipe 35 is sealed relative to an external environment, and a pressure in the inner space of the heat pipe 35 is reduced by performing a degassing process. The heat pipe 35 is a heat transport member that transports heat along a longitudinal direction.

In the heat sink 2, as viewed in a plan view, a width of the heat insulating part 43 of the container 19 increases as progresses from a heat receiving part 41 toward a heat radiating part 42. With such a configuration, of the plurality of heat pipes 35, 35, 35 . . . , each of the heat pipes 35 located at end portions of the heat transport member 10 in the width direction W has an outwardly-bent portion.

As shown in FIG. 3, the heat pipes 35 extend from the heat insulating part 43 to the heat receiving part 41 of the heat transport member 10. Accordingly, the heat pipes 35 are thermally connected to the heat generating body 100 at the heat receiving part 41 via the container 19 of the heat transport member 10. Due to the above, in addition to a heat transport function of the heat transport member 10, the heat pipes 35 transport heat of the heat generating body 100 from the heat receiving part 41 to the heat insulating part 43 of the heat transport member 10 on the outer surface of the container 19. A portion of each heat pipe 35 that corresponds to the heat receiving part 41 of the heat transport member 10 is a heat receiving part (evaporating part) of the heat pipe 35, and a portion of each heat pipe 35 that corresponds to the heat insulating part 43 of the heat transport member 10 is a heat radiating part (condensing part) of the heat pipe 35. Due to the above, in the heat sink 2, the heat insulating part 43 is a portion at which active heat input into the heat transport member 10 is performed.

Also in the heat sink 2, the heat pipes 35, forming the heat transfer member 39, are disposed with a predetermined space 33 from a first heat radiating fin group 20. Accordingly, the heat pipes 35 are not continuously provided to the first heat radiating fin group 20. That is, the heat pipes 35 do not extend to the first heat radiating fin group 20, and are not thermally connected to the first heat radiating fin group 20. Due to the above, also in the heat sink 2, neither the heat transfer member 39 nor the first heat radiating fin group 20 is provided at a boundary portion between the heat insulating part 43 and the heat radiating part 42 of the heat transport member 10. The heat transfer member 39 is not provided to a portion of the heat insulating part 43 of the heat transport member 10 in the vicinity of the heat radiating part 42.

In the same manner as the container 19 of the heat transport member 10, examples of a material of a container formed by the heat pipe 35 may include stainless steel, copper, copper alloy, aluminum, aluminum alloy, tin, tin alloy, titanium, titanium alloy, nickel, and nickel alloy. The working fluid to be sealed in the inner space of the container formed by the heat pipe 35 may be suitably selectable according to compatibility with the material of the container, and an example of the working fluid may include water.

In the same manner as the heat sink 1, also in the heat sink 2, at another end of the heat transport member 10 in a heat transport direction H, the first heat radiating fins 21 are thermally connected to the container 19 in a state of being divided for both surfaces of the container 19.

In the heat sink 2 according to the second embodiment of the present disclosure, the heat pipes 35, forming the heat transfer member 39, are thermally connected to the outer surface of the heat insulating part 43 located between the heat receiving part 41 and the heat radiating part 42 of the heat transport member 10 and hence, heat is inputted into the heat transport member 10 from the heat pipes 35 at the heat insulating part 43 of the heat transport member 10 due to a heat transport action of the heat pipes 35. Accordingly, in the heat sink 2, the working fluid sealed in the heat transport member 10 receives heat at the heat insulating part 43 of the heat transport member 10. The liquid-phase working fluid sealed in the heat transport member 10 receives heat at the heat insulating part 43 and hence, the liquid-phase working fluid in the heat transport member 10 receives heat within a range from the heat receiving part 41 to the heat insulating part 43, thus preventing freezing of the liquid-phase working fluid in the heat transport member 10 at the heat insulating part 43 and at the heat radiating part 42, which is disposed adjacent to the heat insulating part 43. Accordingly, according to the aspect of the heat sink 2, it is possible to prevent dryout in the heat transport member 10 without impairing heat transfer characteristics even when an environmental temperature at the time of use is lower than a melting point of the working fluid.

In the heat sink 2, the heat transfer member 39 is formed by the heat pipes 35 each having the inner space in which the working fluid is sealed and hence, heat transfer to the heat insulating part 43 of the heat transport member 10 is smoothed, and reception of heat by the liquid-phase working fluid sealed in the heat transport member 10 is promoted at the heat insulating part 43. Therefore, freezing of the liquid-phase working fluid sealed in the heat transport member 10 is more surely prevented at the heat insulating part 43 and at the heat radiating part 42, which is disposed adjacent to the heat insulating part 43. Accordingly, in the heat sink 2, even when the environmental temperature at the time of use is lower than the melting point of the working fluid, it is possible to more surely prevent dryout in the heat transport member 10.

In the heat sink 2, the heat pipes 35 extend from the heat insulating part 43 to the heat receiving part 41 of the heat transport member 10 and hence, heat transport from the heat receiving part 41 to the heat insulating part 43 of the heat transport member 10 is promoted due to the heat transport action of the heat pipes 35, forming the heat transfer member 39. Accordingly, an amount of heat received by the liquid-phase working fluid sealed in the heat transport member 10 is surely increased at the heat insulating part 43 and hence, freezing of the liquid-phase working fluid in the heat transport member 10 is further surely prevented at the heat insulating part 43 and at the heat radiating part 42, which is disposed adjacent to the heat insulating part 43.

Also in the heat sink 2, the heat pipes 35, forming the heat transfer member 39, are disposed with the predetermined space 33 from the first heat radiating fin group 20 and hence, it is possible to prevent excessive promotion of heat radiation from the entire heat sink 2. Accordingly, even when the environmental temperature at the time of use is lower than the melting point of the working fluid, it is possible to more surely prevent dryout in the heat transport member 10.

Figure 4:
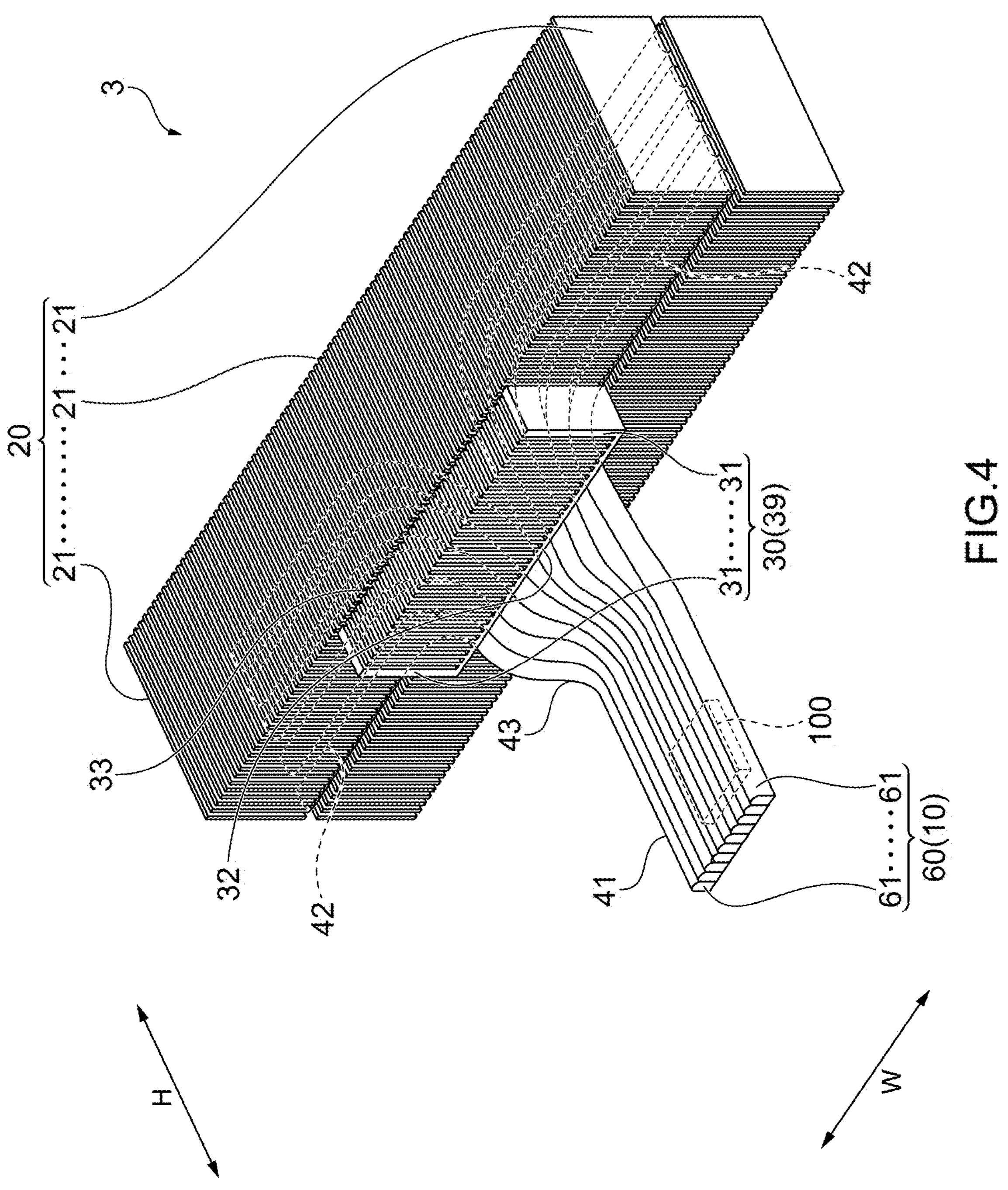
FIG. 4 is perspective view illustrating a summary of a heat sink according to a third embodiment of the present disclosure.
Figure 5:
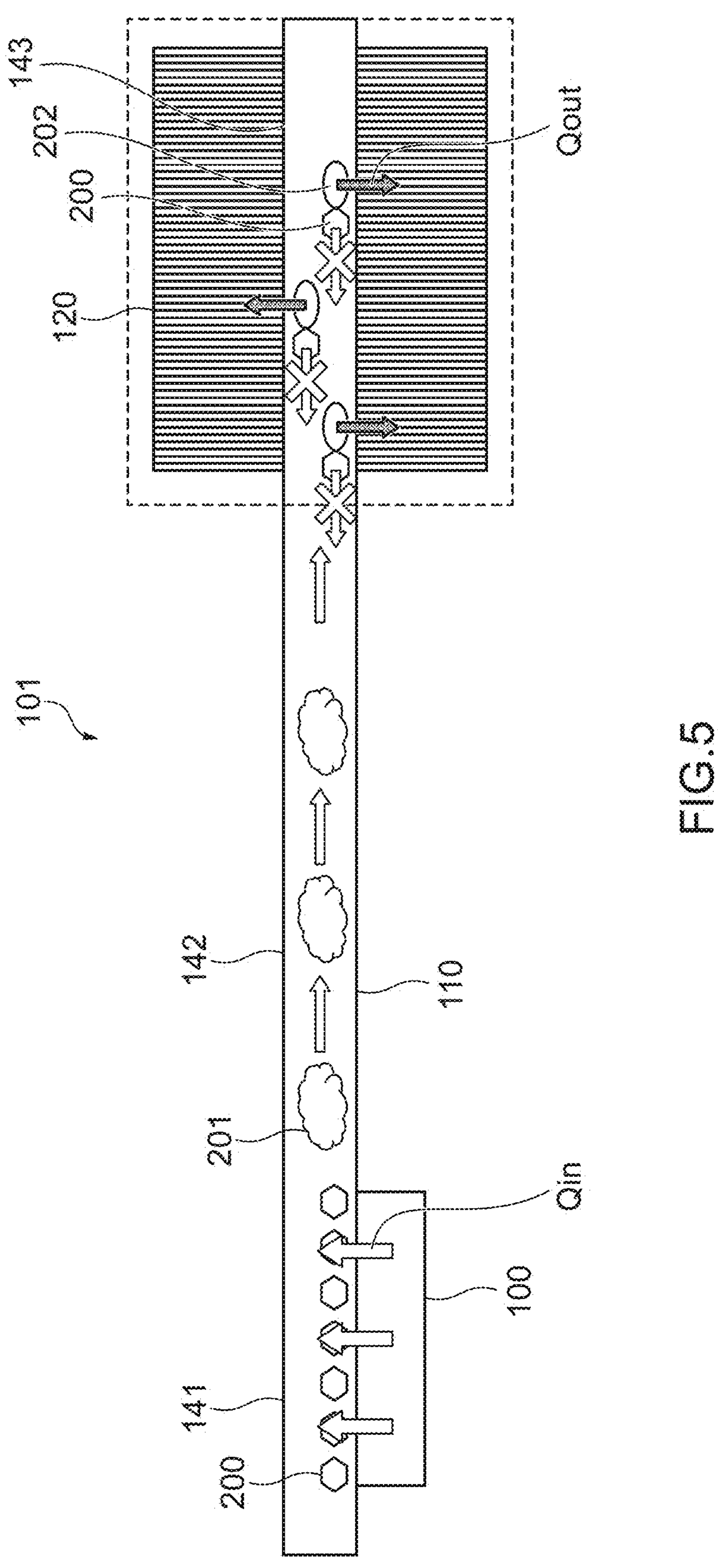
FIG. 5 is a side view illustrating a summary of a conventional heat sink.

Next, the detail of a heat sink according to a third embodiment of the present disclosure will be described. Main constitutional elements of the heat sink according to the third embodiment are identical to the corresponding main constitutional elements of the heat sinks according to the first and second embodiments and hence, the constitutional elements identical to the corresponding constitutional elements of the heat sinks according to the first and second embodiments will be described by using the same reference symbols. FIG. 4 is a perspective view illustrating a summary of the heat sink according to the third embodiment of the present disclosure.

In the heat sinks 1, 2 according to the first and second embodiments, the heat transport member 10 is a vapor chamber in which a type of the container 19 is a planar type, and the entire inner space of the container 19 is an integral space. In contrast, in a heat sink 3 according to the third embodiment, as shown in FIG. 4, a heat transport member 10 is formed by a heat pipe group 60 in which a plurality of heat pipes 61, 61, 61 . . . are arranged in parallel. In the heat sink 3, a heat insulating part 43 of the heat pipe group 60, forming the heat transport member 10, is flattened, and a plurality of second heat radiating fins 31, 31, 31 . . . are erected on an outer surface of the flattened heat pipe group 60 to form a second heat radiating fin group 30. Also in the heat sink 3, the second heat radiating fin group 30, forming a heat transfer member 39, is disposed with a predetermined space 33 from a first heat radiating fin group 20.

In the heat sink 3, the heat transport member 10 is formed of the heat pipe group 60, in which the plurality of heat pipes 61, 61, 61 . . . are arranged in parallel, thus having a configuration in which an inner space of the heat transport member 10 is divided into a plurality of spaces. Each heat pipe 61 is a tubular body having a radial direction and a longitudinal direction. The heat pipe 61 is a member having an inner space in which a working fluid is sealed, and a pressure in the inner space of the heat pipe 61 is reduced by performing a degassing process. Due to the above-mentioned internal structure, the heat pipe 61 is a member having a heat transport function.

At a heat receiving part 41 and the heat insulating part 43 of the heat pipe group 60, forming the heat transport member 10, the plurality of heat pipes 61, 61, 61 . . . are arranged in parallel along the radial direction of the heat pipe 61. In contrast, at a heat radiating part 42 of the heat pipe group 60, forming the heat transport member 10, the heat pipes 61 are bent into an L shape corresponding to a configuration in which the heat radiating part 42 of the heat transport member 10 has a larger width than the heat receiving part 41 or the heat insulating part 43. Heat pipes 61 located at a left portion of the heat pipe group 60 are bent in a leftward direction at the heat radiating part 42, and extend in the leftward direction on the heat radiating part 42. Heat pipes 61 located at a right portion of the heat pipe group 60 are bent in a rightward direction at the heat radiating part 42, and extend in the rightward direction on the heat radiating part 42.

The second heat radiating fin group 30 is configured such that a plurality of second heat radiating fins 31, 31, 31 . . . are erected on one plate 32, and the plurality of second heat radiating fins 31, 31, 31 . . . are fixed to the plate 32. Accordingly, the plurality of second heat radiating fins 31, 31, 31 . . . are formed into an integral body by the plate 32. The plate 32 of the second heat radiating fin group 30 extends along a width direction W of the heat transport member 10, and the plate 32 is in contact with the outer surface of the flattened heat pipe group 60.

Also in the heat sink 3, the second heat radiating fin group 30, forming the heat transfer member 39, is thermally connected to the heat insulating part 43 located between the heat receiving part 41 and the heat radiating part 42 of the heat pipe group 60, forming the heat transport member 10, and hence, heat is radiated from the heat sink 3 at the heat insulating part 43 due to a heat exchange action of the second heat radiating fin group 30. Therefore, the heat is released from the working fluid at the heat insulating part 43. The heat is released from the gas-phase working fluid at the heat insulating part 43 and hence, a portion of the gas-phase working fluid changes phase from a gas phase to a liquid phase at the heat insulating part 43, which is disposed adjacent to the heat receiving part 41, instead of changing phase at the heat radiating part 42. The portion of the gas-phase working fluid flowing through the heat insulating part 43 changes phase to a liquid phase and hence, a portion of a liquid-phase working fluid has a shortened reflux distance to the heat receiving part 41. As a result, the reflux of the liquid-phase working fluid to the heat receiving part 41 is smoothed. Further, the portion of the gas-phase working fluid changes phase from a gas phase to a liquid phase at the heat insulating part 43 instead of changing phase at the heat radiating part 42 where the liquid-phase working fluid is more likely to freeze than at the heat receiving part 41 or the heat insulating part 43 and hence, freezing of the liquid-phase working fluid is prevented. Accordingly, also in the heat sink 3, it is possible to prevent dryout in the heat transport member 10 without impairing heat transfer characteristics even when an environmental temperature at the time of use is lower than a melting point of the working fluid.

Next, other embodiments of the present disclosure will be described. In the heat sinks of the above-mentioned respective embodiments, the first heat radiating fins are erected on both surfaces of the container. However, the first heat radiating fins may be erected on only one surface of the container. In the heat sinks of the above-mentioned respective embodiments, of both surfaces of the container of the heat transport member, the heat transfer member is provided to only a surface to which the heat generating body is not thermally connected. However, instead of such a configuration, the heat transfer member may be provided to each of both surfaces of the container of the heat transport member, or may be provided to only a surface to which the heat generating body is thermally connected.

In the heat sink of the third embodiment, the plurality of second heat radiating fins are fixed to the plate. However, instead of such a configuration, a plurality of independent second heat radiating fins having a U shape may be coupled to the plate. Further, heat pipes extending from the heat receiving part to the heat insulating part may be thermally connected to the heat sink of the third embodiment as the heat transfer member.

The heat sink of the present disclosure can prevent dryout even when an environmental temperature at the time of use is lower than a melting point of a working fluid, thus having a high utility value particularly in the field of cooling heat generating bodies, such as electronic components, installed in a low temperature environments.

What is claimed is:

1. A heat sink comprising:

a heat transport container including a heat receiving part thermally connected to a heat generating body;

a first heat radiating fin group in which a plurality of first heat radiating fins are arranged, the first heat radiating fin group being thermally connected to the heat transport container at a heat radiating part; and a second heat radiating fin group in which a plurality of second heat radiating fins are arranged, the second heat radiating fin group being thermally connected to the heat transport container at a heat insulating part, wherein the heat insulating part is located between the heat receiving part and the heat radiating part, wherein the heat transport container has a first inner space that communicates from the heat receiving part to the heat radiating part via the heat insulating part, and in which a first working fluid is sealed, wherein the second heat radiating fin group is spaced from the first heat radiating fin group, and wherein the second fin group has a fin area that is smaller than a fin area of the first heat radiating fin group.

2. The heat sink according to claim 1, further comprising a heat pipe located within the heat transfer container, the heat pipe having a second inner space in which a second working fluid is sealed.

3. The heat sink according to claim 2, wherein the heat pipe extends from the heat insulating part to the heat receiving part.

4. The heat sink according to claim 1, wherein the first inner space of the heat transport container is a single integral space.

5. The heat sink according to claim 1, wherein the heat radiating part of the heat transport container has a larger width than the heat receiving part.

* * * * *